United States Patent [19]

To et al.

[11] Patent Number: 6,051,999
[45] Date of Patent: Apr. 18, 2000

[54] LOW VOLTAGE PROGRAMMABLE COMPLEMENTARY INPUT STAGE SENSE AMPLIFIER

[75] Inventors: Hing Yan To, Folsom; Jahanshir J. Javanifard, Sacramento, both of Calif.; Michelle Y. Eng, East Brunswick, N.J.

[73] Assignee: Intel Corporation, Santa Clara, Calif.

[21] Appl. No.: 09/006,770

[22] Filed: Jan. 14, 1998

[51] Int. Cl.[7] .................................................... H03K 5/22
[52] U.S. Cl. ................................ 327/66; 327/65; 327/89
[58] Field of Search ................................. 327/52, 53, 56, 327/65, 66, 74, 75, 77, 88, 89, 560–561; 330/311, 261, 253

[56] References Cited

U.S. PATENT DOCUMENTS

| | | | |
|---|---|---|---|
| 4,528,515 | 7/1985 | Gross | 330/254 |
| 4,554,515 | 11/1985 | Burson et al. | 330/261 |
| 4,797,631 | 1/1989 | Hsu et al. | 330/253 |
| 5,153,529 | 10/1992 | Koda et al. | 330/295 |
| 5,610,557 | 3/1997 | Jett, Jr. | 330/261 |
| 5,729,177 | 3/1998 | Goutti | 330/257 |
| 5,808,513 | 9/1998 | Archer | 330/253 |

OTHER PUBLICATIONS

Ron Hogervost & Johan Huijsing, Design of Low–Voltage, Low–Power Operational Amplifier Cells, Kluwer Academic Publishers, Boston (1996), pp. 22, 23, 27–29.

Satoshi Sakurai & Mohammed Ismael, Low–Voltage, CMOS Operational Amplifier Theory, Design & Implementation, Kluwer Academic Publishers, Boston (1995), pp. 87–89, 219.

Phillip Allen & Doug Holberg, CMOS Analog Circuit Design, Oxford University Press, New York (1987), pp. 421, 422.

Flash Memory: vol. I, Intel Corporation (1994), pp. 3–282 to 3–292.

*Primary Examiner*—Toan Tran
*Attorney, Agent, or Firm*—Blakely, Sokoloff, Taylor & Zafman LLP

[57] ABSTRACT

A circuit for controlling the bias current in a differential amplifier is disclosed. A differential amplifier comprising complementary differential input transistor pairs includes variable bias current sources to provide bias currents to the differential input pairs. The variable bias current sources are coupled to an input current control unit that includes one or more programmable switches to vary the amount of bias current supplied to the differential input pairs. The slew rate, differential gain, and common mode input range of the differential amplifier may be varied by adjusting the bias currents to the differential input pairs. A cascode circuit is coupled between the differential input pairs and their respective load circuits to extend the common mode input range to the supply voltage rail values.

17 Claims, 7 Drawing Sheets

LOW VOLTAGE PROGRAMMABLE COMPLEMENTARY INPUT STAGE SENSE AMPLIFIER

FIELD OF THE INVENTION

The present invention relates generally to integrated circuits, and more specifically to extending the operation of differential amplifiers at low power supply voltage and low input voltage levels.

BACKGROUND OF THE INVENTION

Flash memory has developed into a popular source of non-volatile, electrically erasable memory in a wide range of digital applications. Flash memory devices typically use a one-transistor memory cell which allows for high memory densities, high reliability and low power consumption. These characteristics have made flash memory very popular for low power applications, such as battery-backed or embedded memory circuits.

A crucial circuit in the operation of flash memory is the precision voltage reference circuit. In a precision voltage reference circuit, a differential amplifier is typically used to sense a difference in current between two flash cells. Flash cells can also be used in other comparator or sense amplifier circuits to provide reference voltages for the inputs of differential amplifiers.

The use of flash memory in low voltage applications has encouraged the production of such devices through production processes that are capable of producing small-scale devices that feature high-speed and low power consumption. However, as process technology shrinks the feature sizes of transistors, integrated circuit operating voltages must be reduced every process generation to limit the tolerant electric fields across the terminals of the transistors. For example, in certain semiconductor manufacturing processes, voltages in excess of 2.0V across the gate-drain junctions of the transistors pose a potential for gate oxide breakdown, thus negatively impacting the reliability and quality of the devices produced through these processes. Although transistors produced with the latest process technology often feature faster performance and lower power supply requirements, certain devices produced by a particular semiconductor production process may exhibit different slew rate and gain characteristics from other devices produced by that process.

When used in low-voltage applications, such variations in amplifier characteristics among devices in a circuit may become quite critical. This is due to the fact that low-voltage comparators and differential amplifiers are often limited to relatively small input voltage ranges because the rail-to-rail common mode input range is limited by a low supply voltage and the fixed threshold voltage of the transistor devices comprising the differential amplifier.

Differential amplifier circuits produced by present semiconductor production processes are produced with a fixed bias current source. The amount of bias (or tail) current used to drive a differential amplifier affects the slew rate (speed) of the amplifier, as well as the differential gain and common-mode range of the amplifier. However, if the bias current source is fixed, these characteristics cannot easily be changed to alter the performance of a differential amplifier, or to compensate for variations in the characteristics of devices made from a particular production process.

SUMMARY OF THE INVENTION

A circuit is disclosed for controlling the bias current of a differential amplifier circuit and improving performance of such a circuit at low supply voltage and low input voltage levels. Two complementary differential input pairs of transistors are coupled between the inverting and non-inverting input terminals of a differential amplifier. Variable current sources provide the bias current for each of the differential input pairs. The variable current sources are coupled to an input current control unit. The input current control unit varies the amount of tail current used to bias the complementary differential input transistor pairs.

Other features and advantages of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

A programmable complementary input stage for use in a low voltage differential amplifier is described. In one embodiment of the present invention, the input stage includes two complementary differential input pairs of transistors with variable current sources that provide the bias current for each of the differential input pairs. The variable current sources are coupled to an input current control unit that varies the amount of tail current used to bias the complementary differential input transistor pairs. Adjusting the bias current causes the slew rate of the differential input transistors to vary in relation to the differential gain and the common mode input range characteristics of the input transistors. In a further embodiment of the present invention, the differential input pairs are coupled to transistor loads through a cascode stage. The cascode stage increases the common mode input range to nearly the entire rail-to-rail supply voltage range.

It is an intended advantage of embodiments of the invention to provide a programmable bias current control for a differential amplifier input stage that facilitates varying the speed, gain, and common mode input range characteristics of the amplifier. It is a further intended advantage of embodiments of the invention to provide a differential amplifier input stage that provides a wide input range at low supply voltage levels.

Figure 1:
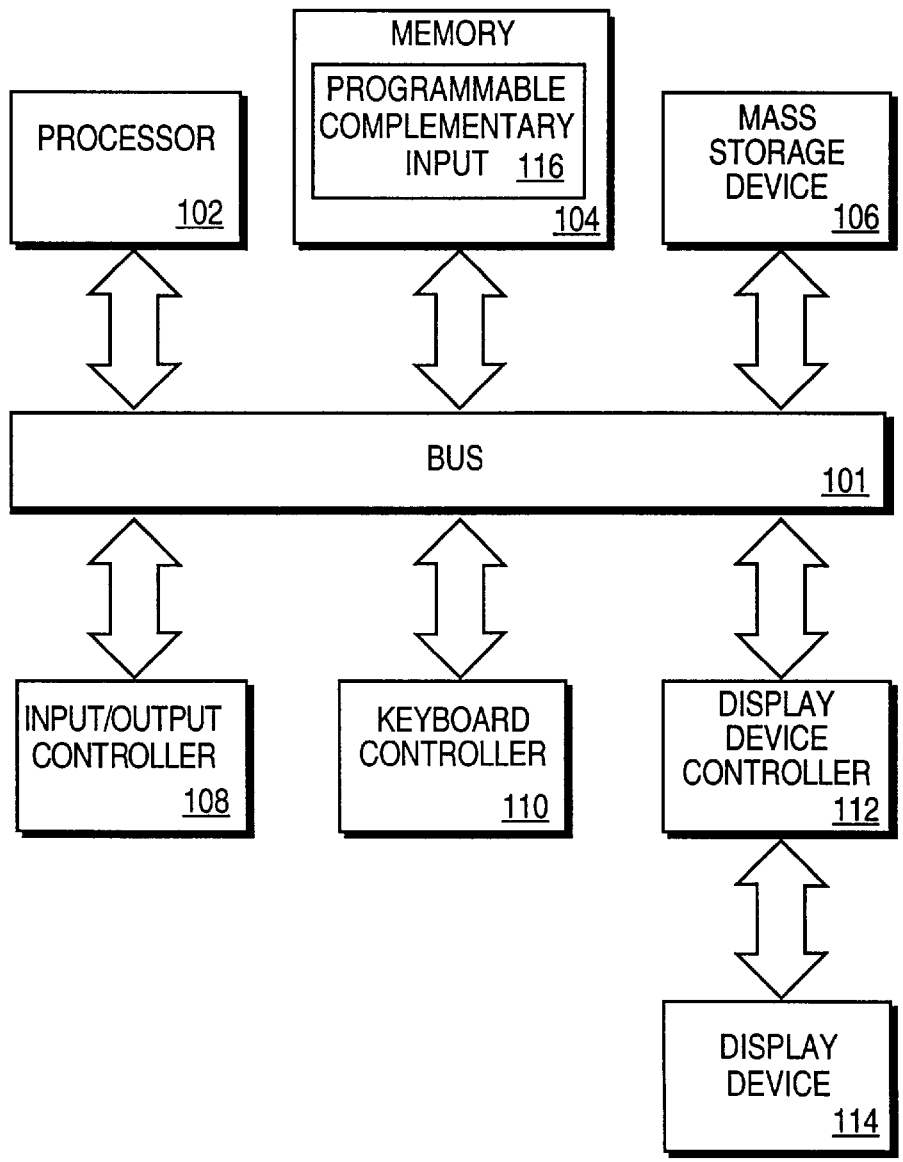
FIG. 1 is a block diagram of a computer system that includes an embodiment of the present invention.

FIG. 1 illustrates a block diagram of a computer system that incorporates embodiments of the present invention. The computer system 100 includes a processor 102 coupled through a bus 101 to a memory 104 and a mass storage device 106, such as a hard disk. In certain embodiments of the present invention, memory 104 is random access memory ("RAM"), read-only memory ("ROM"), or other non-volatile memory, such as flash memory. A keyboard controller 110 is coupled to bus 101 for receiving commands or data entered through a keyboard, mouse, or similar input device. A display device controller 112 is also coupled to bus 101 for providing output through an appropriately coupled display device 114. Also coupled to bus 101 is an input/output controller 108 for interfacing processor 102 to other devices such as network interface devices and the like.

In one embodiment of the present invention, a programmable complementary input stage differential amplifier is contained in one or more devices in computer system 100. For example, in one embodiment, memory 104 is a flash memory device that contains a number of memory cells coupled to input signals through one or more differential amplifier input circuits. Memory 104 includes a programmable complementary input stage 116 that provides variable bias currents for a differential amplifier input circuit. The composition and operation of programmable complementary input stage 116 will be provided in greater detail in the discussion that follows.

It should be noted that the architecture of FIG. 1 is provided only for purposes of illustration, and that a computer system that implements embodiments of the present invention is not limited to this specific architecture. It should be further noted that flash memory is also prominently used in electronic circuits other than computer systems. For example, flash memory is used in devices such as cellular phones, pagers, digital cameras, personal digital assistants, and other like devices that benefit from compact, non-volatile, and low-voltage memory devices.

Figure 2:
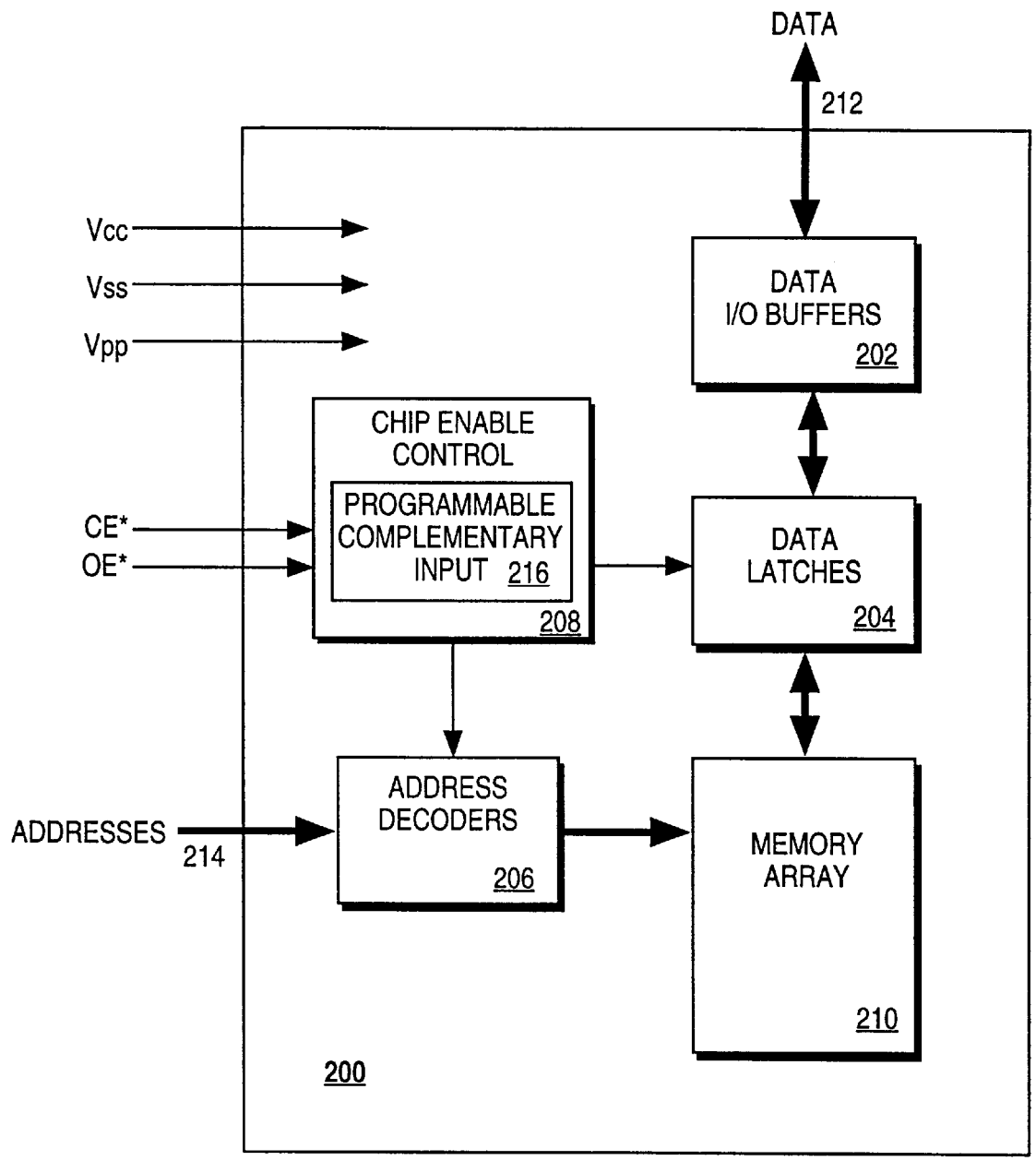
FIG. 2 is block diagram of a memory device that includes a circuit according to one embodiment of the present invention.

FIG. 2 is a block diagram that illustrates major functional blocks within a typical flash memory device, such as memory 104 in computer system 100. Flash memory 200 includes a memory array 210 that consists of a large number of transistors arranged in an array of addressable columns and rows. In a typical flash memory device, each transistor corresponds to a memory cell, which in turn represents a single bit of data. Memory cells from which data is to be read from or written to within memory array 210 are provided by address lines 214 through address decoders 206. Data to be read from or written to memory array 210 is provided through data lines 212. Data lines 212 are provided to memory array 210 through data input/output buffers 202, which provide the appropriate driving levels for the data signals, and data latches 204, which provide the appropriate read/write timing synchronization for the data signals.

A data transfer operation from flash memory 200 is controlled by chip enable control unit 208. Chip enable control unit 208 receives chip enable and output enable control signals from a processor or memory access device and provides control signals to data latches 204 and address decoders 206. Through these control signals, chip enable control unit 208 controls the addressing and data read/write operations to and from memory array 210. Flash memory 200 receives supply voltage signals $V_{cc}$ and $V_{ss}$ from an external power supply source. Flash memory 200 also receives a programming voltage $V_{pp}$ from the external power supply source.

Data lines 212, address lines 214, and the chip and output enable lines are typically provided to flash memory 200 through a central bus, such as bus 101 in computer system 100. Supply voltages $V_{cc}$, $V_{ss}$, and a chip programming voltage, $V_{pp}$ are also typically provided through power lines provided to each of the main components of computer system 100 through a dedicated power bus. Alternatively, however, main bus 101 may also provide voltage levels to each of the devices.

Proper operation of a memory device, such as flash memory 200 depends upon proper levels of supply voltage appropriate for the tolerances of the transistors comprising the device. As devices shrink and supply voltage levels drop, transistors become much more sensitive to variations in supply voltage levels. Likewise, the maximum allowable range of input voltages across the inputs of the devices decreases as well, since device characteristics impose limits to these ranges. Such limitations become especially acute in low voltage applications, where power supply voltage, $V_{cc}$, may be on the order of 1.5 V or lower.

In order to assure proper operation at low power voltage levels, many flash memory devices employ comparators or sense amplifiers to compare the supply voltage levels to a reference voltage. In one embodiment of the present invention, chip enable control unit 208 includes one or more sense amplifiers with a programmable complementary input stage 216 to regulate certain operating voltages for flash memory 200. The composition and operation of programmable complementary input stage 216 will be provided in greater detail in the discussion that follows. In one embodiment, complementary input stage 216 is used as a low power detect circuit that operates to halt or re-execute a memory transfer cycle in conditions in which supply voltages are not of the proper level.

Figure 3:
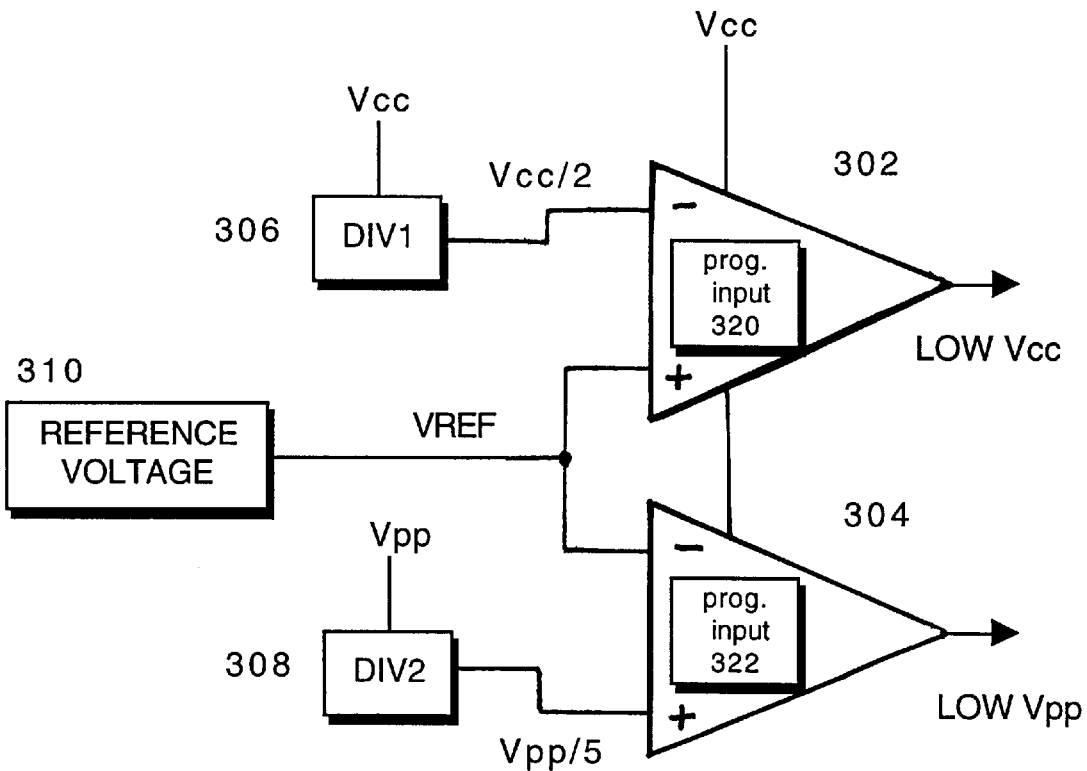
FIG. 3 illustrates an input stage including sense amplifiers for a memory device that is used in an embodiment of the present invention.

FIG. 3 illustrates an example of a low power detect circuit that employs sense amplifiers that monitor supply and program voltages input to a flash memory device, according to one embodiment of the present invention. Low power detect circuit 300 includes operational amplifiers 302 and 304, that are configured as sense amplifiers. Sense amplifier 302 compares a reference voltage, VREF, provided by a reference voltage source 310 with a source voltage, $V_{cc}$, value. The source voltage value may be a straight $V_{cc}$ level, or it may be $V_{cc}$ divided by some value through a divider circuit 306 (e.g., $V_{cc}/2$). Likewise, sense amplifier 304 compares the programming voltage, $V_{pp}$, with VREF. If VREF is greater than the divided power supply voltage, the Low $V_{cc}$ or Low $V_{pp}$ signal is driven high. These signals are used by control circuits within the flash memory to block read and write operations or reset the device.

Operational amplifiers, such as sense amps 302 and 304 in FIG. 3 contain differential amplifiers at their input stages. Differential amplifiers amplify the voltage difference between two input signals. Thus, for sense amplifier 302 in FIG. 3, the differential input stage amplifies the voltage difference between the input $V_{cc}$ level and VREF. In one embodiment of the present invention, amplifiers 302 and 304 each contain a programmable complementary input stage that provides a programmable bias current to the input transistors. Amplifier 302 contains a programmable differential input stage 320, and amplifier 304 contains a programmable differential input stage 322.

One important characteristic associated with differential amplifiers is slew rate, which is the maximum current available to charge or discharge a capacitance. The slew rate is a measure of an amplifier's maximum output current sourcing and sinking abilities, and represents the speed of the device because the current driving capabilities determine how fast the amplifier can swing from one voltage level to another when a step input is applied. For operational amplifiers produced through existing processes, the current driving capabilities are determined by tail current bias devices, such as resistive loads or transistor current sources. Because of limitations in present production processes, these current bias devices are fixed. Therefore, the bias currents for differential amplifiers produced by these processes can not easily be altered. Moreover, because these devices are produced by processes that cannot ensure absolute consistency of characteristics from one device to another, some variation in speed and gain may be present in differential amplifiers using these devices.

Figure 4:
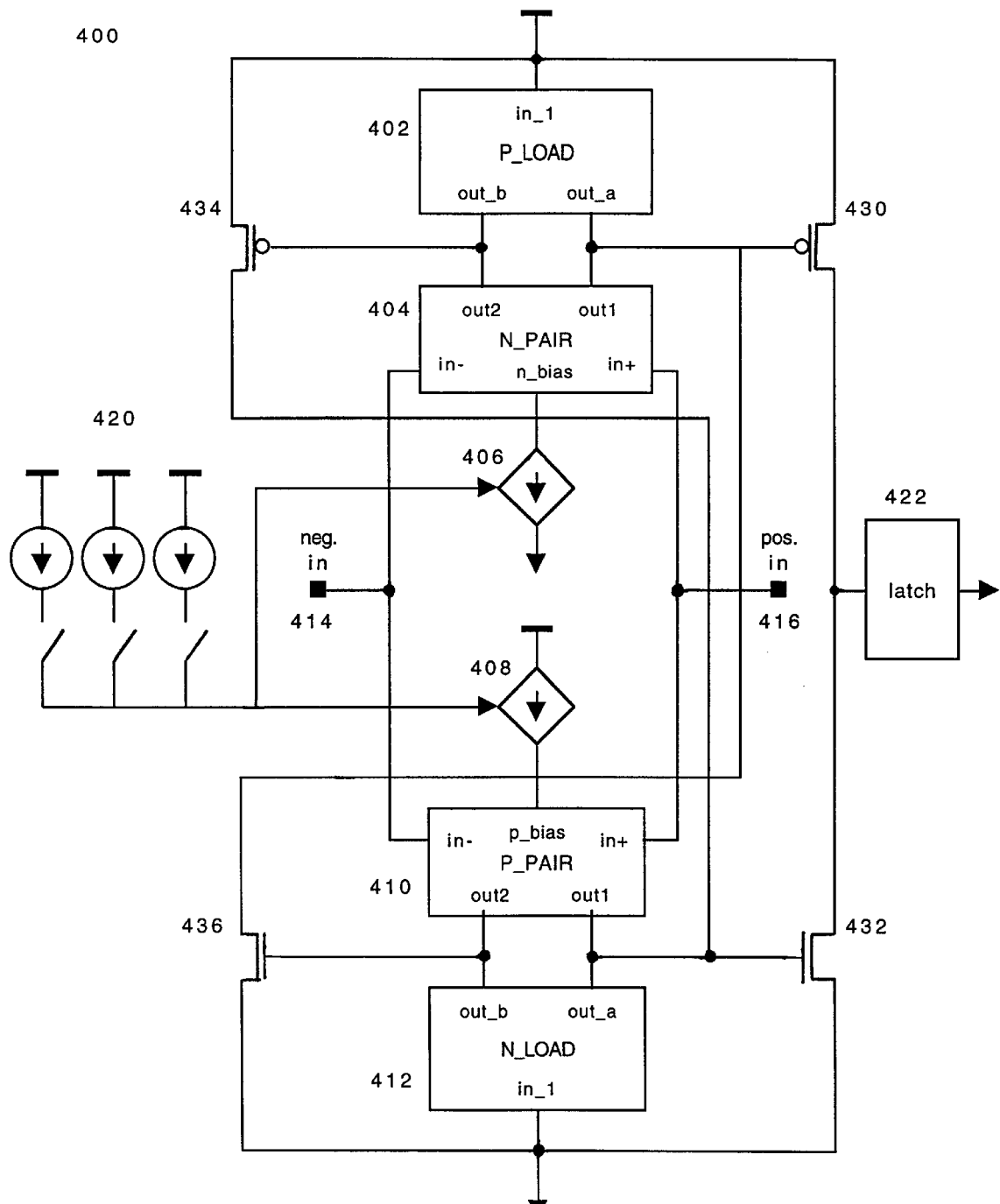
FIG. 4 is a block diagram of a complementary input stage of an operational amplifier with a programmable input current control unit according to one embodiment of the present invention.

FIG. 4 is a block diagram illustrating a differential amplifier that is used for the input stages of amplifiers 304 and 302 of FIG. 3, according to one embodiment of the present invention. FIG. 4 illustrates a differential amplifier that features increased input voltage range response and programmable bias current. Differential amplifier 400 includes complementary pair of input CMOS transistors coupled between the positive (non-inverting) and negative (inverting) inputs of the operational amplifier. CMOS field effect transistors (FET's) are available in two polarities, n-channel and p-channel. A differential amplifier is typically constructed by connecting two transistors between the two inputs and taking the output from the drain of one of the transistors. Typically a differential amplifier that features a single differential pair works only for a limited range of input voltages. This limitation is due largely to a threshold voltage ($V_t$) value of the transistors that prevents the transmission of sufficient current to put the devices in saturation. For example, if $V_t$ of an n-channel FET is 0.8 V, use of such a transistor in a low supply voltage application, e.g., $V_{cc}$ of 2.0 V or less, would limit the input voltage range to less than 1.2 V.

An embodiment of the present invention includes a complementary pair of differential input transistors to increase the input common-mode range of an operational amplifier. An n-channel differential input pair (n-pair) 404 is connected between the negative input 414 and the positive input 416. Similarly, a p-channel differential input pair (p-pair) 410 is connected between the negative input 414 and the positive input 416. In general, the n-pair differential amplifier operates optimally across the high-end range of input voltages (i.e., $V_{in} > V_{ss} + V_{sat}$); and the p-pair differential amplifier operates optimally across the low-end range of input voltages (i.e., $V_{in} < V_{dd} - V_{sat}$). Placing the n-pair and p-pair differential amplifiers in a complementary arrangement enables better response for both the high-end and low-end common-mode range of input voltages. The outputs of differential amplifiers 404 and 410 are connected to an output circuit, represented as latch 422, through a push-pull output stage comprising transistors 430 and 432. Cross coupling of the output signals is provided by transistors 434 and 436.

The N-pair differential input 404 is connected to supply voltage $V_{cc}$ through a load 402. In one embodiment of the present invention, the load 402 is a diode-connected transistor load constructed with p-channel FET devices. The use of diode-connected transistors as an active load provides a high gain figure for the n-pair differential input. Likewise, the p-pair differential input 410 is connected to ground through a diode-connected transistor load 412 constructed with n-channel FET devices. Again, this arrangement yields a very high gain figure for the p-pair differential input. In an alternative embodiment of the present invention, simple resistive loads could be used for the p-load 402 and n-load 412 elements. In a further alternative embodiment of the present invention, current mirror active loads could be used for the p-load 402 and n-load 412 elements.

In one embodiment of the present invention, n-pair differential input 404 is connected to ground through a current source 406, and p-pair differential input 410 is connected to $V_{cc}$ through current source 412. The use of current source biasing for each of the differential amplifiers significantly increases the common mode gain of each of the differential amplifiers 404, and 410. In this embodiment of the present invention, current sources 406 and 408 are variable current sources. These current sources are connected to input current control unit 420. Input current control unit 420 includes one or more current sources connected to variable current sources 406 and 408. In an alternative embodiment of the present invention, current sources 406 and 408 can be replaced by variable bias resistors that can be set by input current control unit 420.

In FIG. 4, input current control unit 420 is illustrated as containing three switchable current sources, however, it should be noted that any number of current sources may be used, depending on the amount of bias current compensation is required. For purposes of illustration, it is assumed that the amount of current supplied by each current source in input current control unit 420 is equal to the nominal bias current supplied by current sources 406 and 408; however, it should also be noted that each current source may produce different amounts of current.

In one embodiment of the present invention, input current control unit 420 includes digitally controlled switches that are controlled by input signals generated by a digital processing unit. For this embodiment, control signals are generated by a sensor or processor that monitors certain amplifier characteristics such as gain and slew rate, and varies the bias current to maintain a certain relationship among these two characteristics. Such a sensor could also be used to measure operating or ambient temperature, and vary the bias current to compensate for temperature effects on amplifier characteristics, such as gain or slew rate.

By coupling current from input current control unit 420 to current sources 406 and 420, the bias current for differential amplifier pairs 404 and 410 may be increased, thus increasing the speed of amplifier 400. For example, if the current available from each current source 406 and 408 was $I_{bias}$, then closing all three switches in input current control unit 420 would increase the bias current by three times the $I_{bias}$ current. For most differential amplifier circuits, an increase in the bias current causes a decrease in the differential gain of the circuit. Therefore, the use of a current control unit allows the speed of the device relative to the gain to be dynamically varied. In general, increasing the bias current also causes a decrease in the common-mode input voltage range in which the amplifier will be operable. In this case, the use of a current control unit also allows the speed of the device relative to the input voltage range to be varied.

Figure 5:
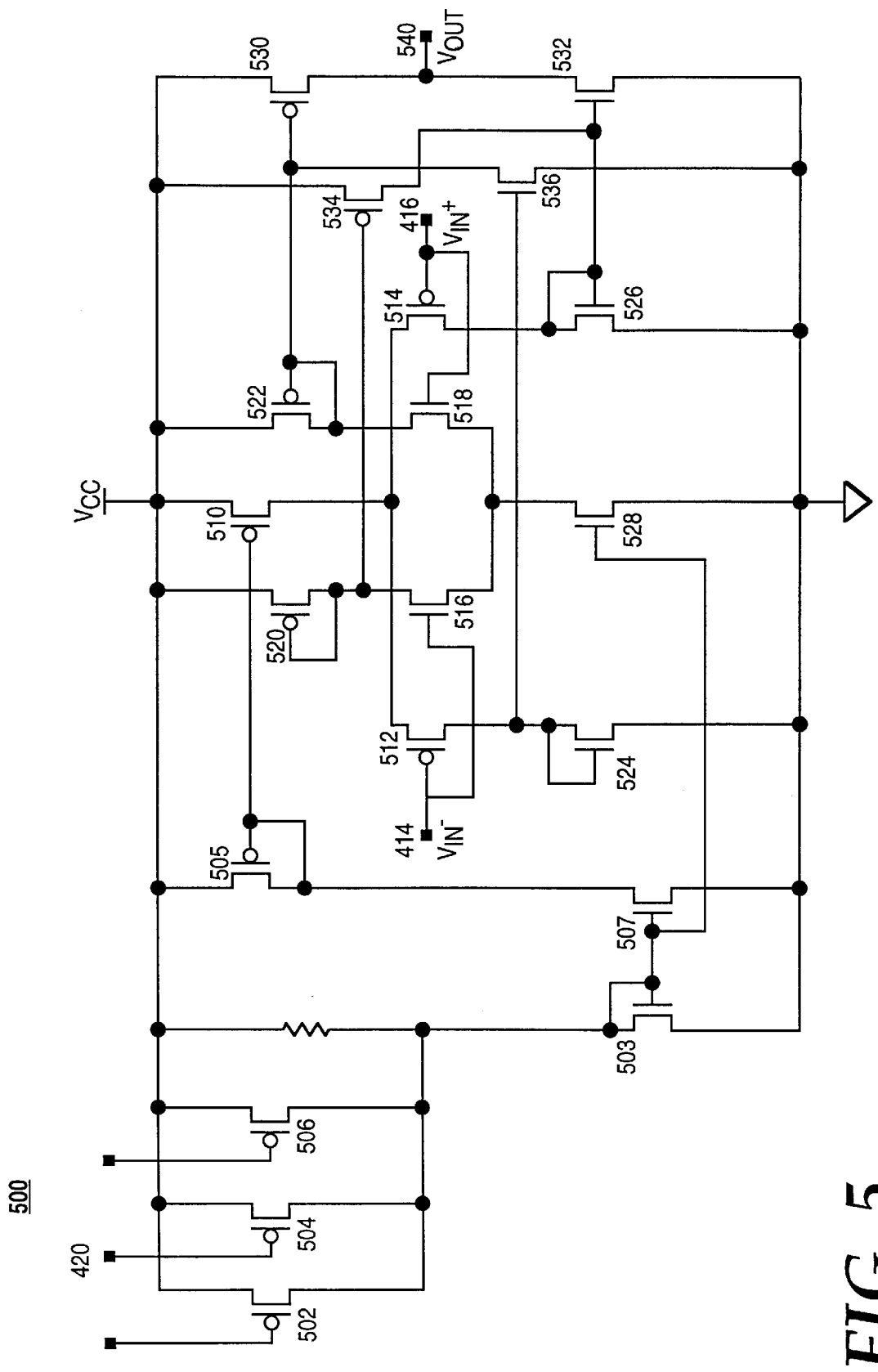
FIG. 5 is a circuit diagram of the complementary input stage with a programmable input current control unit of FIG. 4, according to one embodiment of the present invention.

FIG. 5 is a circuit diagram of the complementary differential amplifier 400 illustrated in FIG. 4. In one embodiment of the present invention, complementary differential amplifier 400 is constructed using MOSFET devices. Transistors 512 and 514 comprise the p-type differential input transistor pair (p-pair), and transistors 516 and 518 comprise the n-type differential input transistor pair (n-pair). Transistors 520 and 522 comprise the p-type transistor load for the n-pair differential input, and transistors 524 and 526 comprise the n-type transistor load for the p-pair differential input. In one embodiment of the present invention, the transistor loads 520 and 522, and 524 and 526 are arranged in a diode-connected transistor configuration. In an alternative embodiment of the present invention, the transistor loads for the differential inputs could be configured in a current mirror configuration. For certain applications, the diode-connected transistor loads maintain a more symmetrical noise cancellation characteristic than traditional current mirror load configurations.

The two differential input pairs are coupled between the positive input voltage terminal 416 and the negative input voltage terminal 414 of the differential amplifier 500. Transistors 530 and 532 comprise the push-pull output stage that couples complementary differential amplifier 500 to a voltage output terminal 540. Transistors 534 and 536 provide cross-coupling of the output signals back to the inputs of the differential input pairs.

Transistor 510 is the bias current source for the p-pair differential input transistors 512 and 514, and transistor 528 is the bias current source for the n-pair differential input transistors 516 and 518. Both current source transistors 510 and 528 are coupled to input current control unit 420. In one embodiment of the present invention, input current control unit 420 comprises three p-type MOSFET devices 502, 504, and 506. The gate terminal of each transistor in input current control unit 420 is connected to an input pad for the input of a control voltage that controls the flow of current through the respective transistor. When the control voltage turns a transistor on, current flows through the transistor to drive current source transistors 510 and 528. Current from the input current control unit 420 is transmitted through transistor 503. This current is then conducted through transistor 505 to the p-pair current source 510 and also through transistor 507 to the n-pair current source 528.

Using appropriate CMOS transistors produced by an appropriate production process, the configuration of complementary differential amplifier 500 of FIG. 5 provides full differential operation with supply voltages as low as 1.5 V, according to one embodiment of the present invention. Operation at lower supply voltage levels may be realized by resizing the circuit devices for operation at lower bias current levels, and adding cascode circuits in the input load stages.

Figure 6:
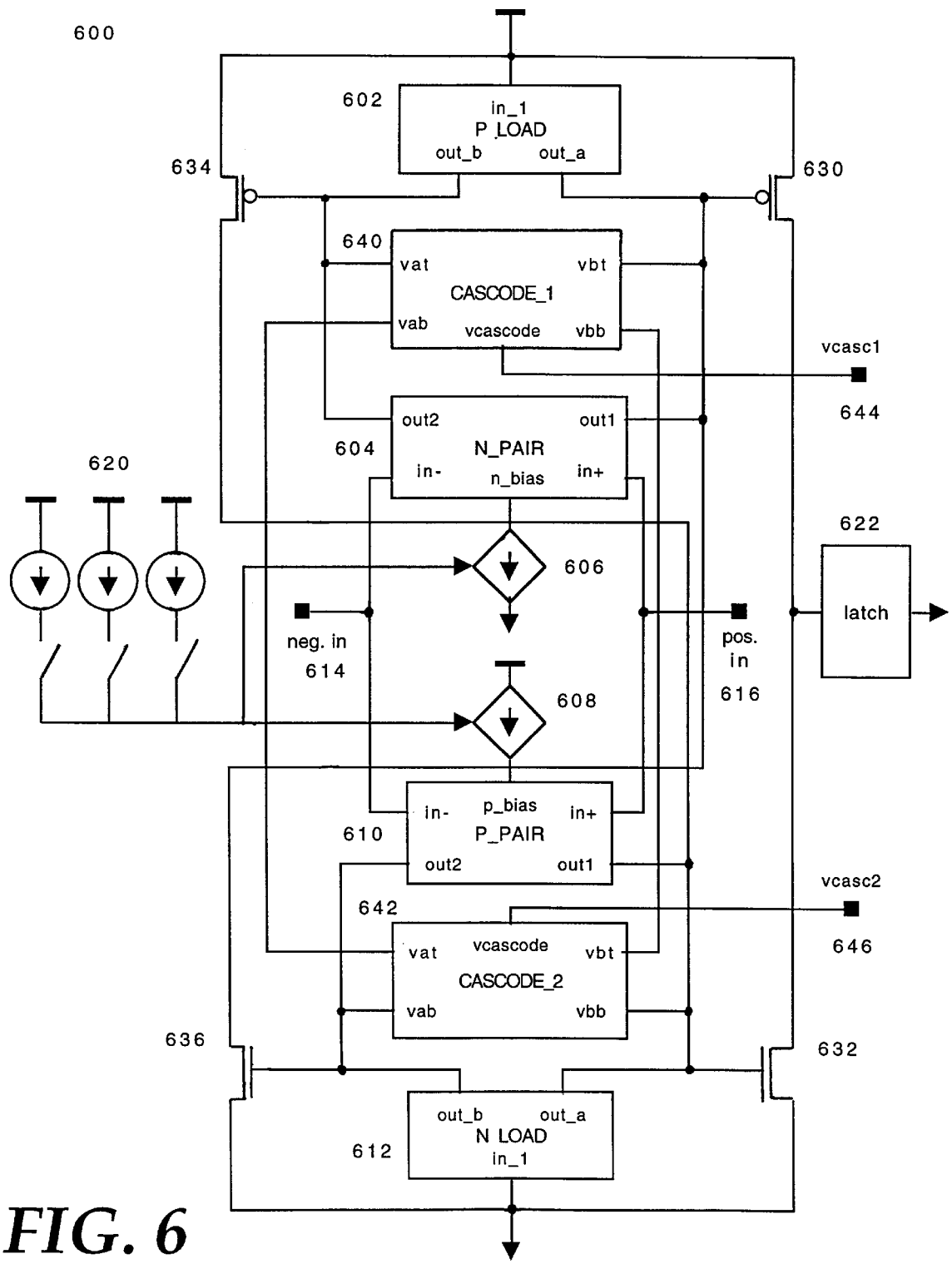
FIG. 6 is a block diagram of a programmable complementary input stage of an operational amplifier with cascode stages according to one embodiment of the present invention.

FIG. 6 is a block diagram that illustrates a complementary differential amplifier with a programmable bias current source according to an alternative embodiment of the present invention. In complementary differential amplifier 600, an n-pair differential input 604 is connected to a p-transistor load 602 through a cascode stage 640. Similarly, a p-pair differential input 610 is connected to an n-transistor load through a cascode stage 642. Cascode stage 640 is connected to a first cascode input voltage pin 644, and cascode stage 642 is connected to a second cascode input voltage pin 646.

The use of cascode stages for differential amplifiers ensures that the common mode input range can swing rail-to-rail. A cascode device allows an increased common-mode input range due to an opposite polarity input configuration of the differential amplifiers relative to the loads. Each cascode stage allows the input voltage to reach within one saturation voltage value ($V_{dsat}$) of the current source, instead of one gate-source voltage value ($V_{gs}$) of the current source.

As described above in relation to FIG. 4, the n-pair and p-pair differential inputs 604 and 610 are connected to variable current sources 606 and 608, respectively. The variable current sources are connected to a programmable input current control unit 620, that allows the bias current for the differential input pairs to be varied. This allows the speed of circuit 600 to be varied in relation to the gain and/or the input voltage range of the amplifier. The outputs of differential inputs 604 and 610 are connected to an output circuit, represented as latch 622, through a push-pull output stage comprising transistors 630 and 632. Cross coupling of the output signals is provided by transistors 634 and 636.

Figure 7:
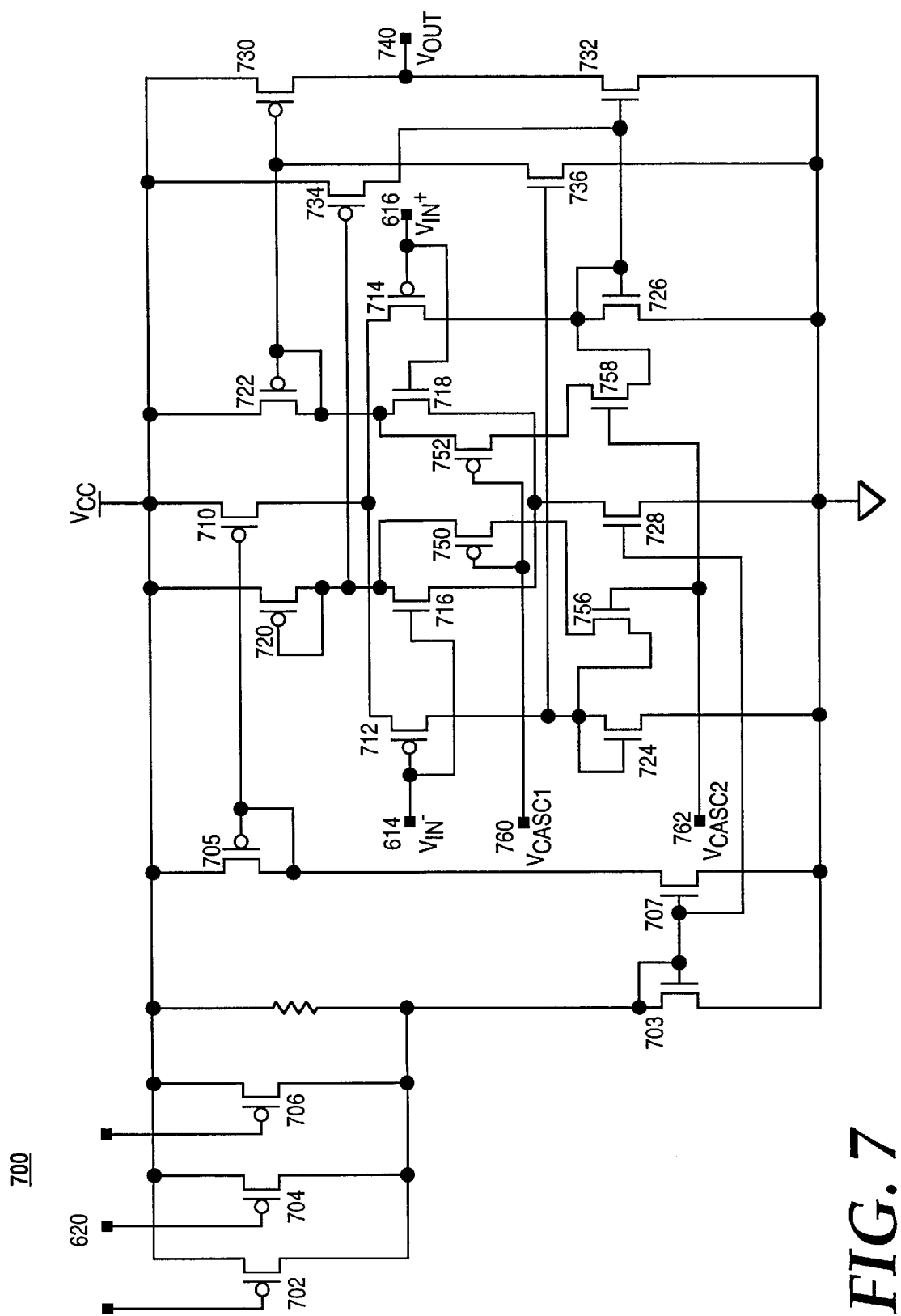
FIG. 7 is a circuit diagram of the programmable complementary input stage with cascode stages of FIG. 6, according to one embodiment of the present invention.

FIG. 7 is a circuit diagram of the complementary differential amplifier 600 illustrated in FIG. 6. In one embodiment of the present invention, complementary differential amplifier 700 is constructed using MOSFET devices. Transistors 712 and 714 comprise the p-pair differential input, and transistors 716 and 718 comprise the n-pair differential input. Transistors 720 and 722 comprise the p-type transistor load for the n-pair differential input, and transistors 724 and 726 comprise the n-type transistor load for the p-pair differential input. In one embodiment of the present invention, the p-type and n-type transistor loads are both diode-connected transistor pairs, as illustrated in FIG. 7.

The two differential input pairs (p-pair and n-pair) are coupled between the positive input voltage terminal 616 and the negative input voltage terminal 614 of the differential amplifier 600. Transistors 730 and 732 comprise the push-pull output stage that couples complementary differential amplifier 700 to a voltage output terminal 740. Transistors 734 and 736 provide cross-coupling of the output signals back to the inputs of the differential input pairs.

Transistor 710 is the bias current source for the p-pair differential input transistors 712 and 714, and transistor 728 is the bias current source for the n-pair differential input transistors 716 and 718. Both current source transistors 710 and 728 are coupled to input current control unit 620. In one embodiment of the present invention, input current control unit 620 comprises three p-type MOSFET devices 702, 704, and 706. The gate terminal of each transistor in input current control unit 620 is connected to an input pad for the input of a control voltage that controls the flow of current through the respective transistor. When the control voltage turns a transistor on, current flows through the transistor to drive current source transistors 710 and 728. Current from the input current control unit 620 is transmitted through transistor 703. This current is then conducted through transistor 705 to the p-pair current source 710 and also through transistor 707 to the n-pair current source 728.

Transistors 750 and 752 comprise the cascode stage for the n-pair differential amplifier 716 and 718. This cascode stage is connected to cascode voltage input 760. Transistors 756 and 758 comprise the cascode stage for the p-pair differential amplifier 712 and 714. This cascode stage is connected to cascode voltage input 762. In one embodiment of the present invention, the voltage input through cascode voltage input 760 (Vcasc1) is set high enough to keep the p-load transistors 720 and 722 in saturation. Similarly, the voltage input through cascode voltage input 762 (Vcasc2) is set high enough to keep the n-load 724 and 726 transistors in saturation. This allows the drain voltage of the n-pair and p-pair transistors to reach the input voltage supply rail within one saturation voltage of the bias current source transistors, instead of the gate-source voltage of these transistors, thus considerably improving the common-mode input voltage range swing of differential amplifier 700. In one embodiment of the present invention, voltage to the Vcasc1 input 760 and Vcasc2 input 762 may be provided by transistor voltage dividers.

Using appropriate CMOS transistors produced by an appropriate production process, the configuration of complementary differential amplifier 700 of FIG. 7 provides full differential operation with supply voltages as low as 1.0 V, according to an alternative embodiment of the present invention. For this embodiment, optimum $I_{bias}$ for the current sources is approximately 30 $\mu$A. If $I_{bias}$ is decreased too far below this optimum value, significant propagation delays through the transistor devices are likely to be incurred.

In a further alternative embodiment of the present invention, the output latch device 622, in FIG. 6, is implemented using low threshold voltage (low $V_t$) devices. At present typical CMOS FET devices feature a $V_t$ of approximately 0.6V to 0.7V. Some devices are available, however, that feature a $V_t$ of approximately 0.3V to 0.4V. The use of low threshold voltage devices for output inverters of the cascoded complementary differential amplifier reduces propagation delays caused by low bias current ($I_{bias}$) values. Although low threshold voltage devices feature faster transition times that may offset the effect of low bias current levels, these devices typically feature a higher leakage current, which can cause undesirable effects in certain applications.

In a further alternative embodiment of the present invention, the cascode stages in the complementary differential amplifier 600 of FIG. 6 are implemented in a folded cascode arrangement. A folded cascode circuit can be used when the active loads for the complementary differential amplifiers are current mirrors instead of diode-connected transistor pairs or simple resistive loads.

In the foregoing, a circuit has been described for dynamically varying the bias current for a complementary input stage of a differential amplifier, and for optimizing such a circuit for operation at low supply voltage levels. Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A circuit comprising:
    a first differential input transistor pair having an input;
    a second differential input transistor pair coupled to said first differential input transistor pair having an output;
    a first variable current source supplying bias current to said first differential input transistor pair;
    a second variable current source supplying bias current to said second differential input transistor pair;
    an input current control unit coupled to said first variable current source and to said second variable current source, said input current control unit operable to vary the amount of bias current supplied to said first and said second differential input transistor pairs;
    a first transistor load coupled to said first differential input transistor pair;
    a second transistor load coupled to said second differential input transistor pair;
    a first cascode circuit coupled between said first transistor load and said first differential input transistor pair; and
    a second cascode circuit coupled between said second transistor load and said second differential input transistor pair.

2. The circuit according to claim 1 wherein said input current control unit comprises one or more programmable switches, each of said one or more programmable switches operable to enable or block transmission of current through one or more current paths connected to said first variable current source and said second variable current source.

3. The circuit according to claim 1 wherein each of said first transistor load and said second transistor load is a diode-connected transistor pair.

4. The circuit according to claim 1 wherein each of said first transistor load and said second transistor load comprises two or more transistors arranged in a current mirror configuration.

5. The circuit according to claim 4 further comprising:
    a first cascode circuit coupled between said first transistor load and said first differential input transistor pair; and
    a second cascode circuit coupled between said second transistor load and said second differential input transistor pair.

6. The circuit according to claim 5 wherein each of said first cascode circuit and said second cascode circuit is a folded cascode circuit.

7. The circuit according to claim 1 wherein said first differential input transistor pair comprises two p-channel field effect transistors and said second differential input transistor pair comprises two n-channel field effect transistors.

8. The circuit according to claim 1 wherein each of said one or more programmable switches comprises a field effect transistor coupled between said first and said second variable current sources and a control signal input, said control signal input operable to receive a control signal.

9. The circuit according to claim 8 wherein said control signal is a digital control signal having a first state and a second state, and further wherein said first state causes a corresponding programmable switch to transmit current through one of said one or more current paths, and said second state causes said corresponding programmable switch to block said current from one of said one or more current paths.

10. A circuit comprising:
    a differential amplifier comprising a first differential input transistor pair having an input and a second differential input transistor pair having an output;
    a first variable current source coupled to said first differential input transistor pair and providing a bias current for said first differential input transistor pair;
    a second variable current source coupled to said second differential input transistor pair and providing a bias current for said second differential input transistor pair;
    a programmable current source coupled to said first variable current source and said second variable current source, said programmable current source configured to receive one or more control signals, and operable to vary an amount of bias current provided to said first differential input transistor pair and said second differential input transistor pair depending on a state of said one or more control signals;
    a first cascode circuit coupled between said first differential input transistor pair and a first transistor load; and
    a second cascode circuit coupled between said second differential input transistor pair and a second transistor load.

11. The circuit of claim 10 wherein varying said bias current provided to said first differential input transistor pair and said second differential input transistor pair is operable to change a slew rate characteristic of said differential amplifier and at least one other operating characteristic of said differential amplifier.

12. The circuit of claim 11 wherein said at least one other operating characteristic comprises a differential gain characteristic of said operational amplifier.

13. The circuit of claim 12 wherein said at least one other operating characteristic comprises a common mode input range characteristic of said differential amplifier.

14. The circuit according to claim 10 wherein said programmable current source comprises one or more programmable switches, each of said one or more programmable switches operable to enable or block transmission of current through one or more current paths connected to said first variable current source and said second variable current source.

15. The circuit of claim 14 wherein said differential amplifier comprises the input stage of an operational amplifier, said operational amplifier configured for use in a precision voltage reference circuit.

16. The circuit of claim 15 wherein said precision voltage reference circuit comprises a plurality of flash memory cells, said differential amplifier operable to sense a difference in current between two flash memory cells of said plurality of flash memory cells.

17. The circuit of claim 16 wherein said precision voltage reference circuit is included in one or more devices within a computer system.

* * * * *